US011913978B2

(12) United States Patent
Adkins et al.

(10) Patent No.: US 11,913,978 B2
(45) Date of Patent: Feb. 27, 2024

(54) WIRELESS VOLTAGE MEASUREMENT, TESTING AND ANALYTICS SYSTEM

(71) Applicant: Grace Technologies, Inc., Davenport, IA (US)

(72) Inventors: Charles Adkins, Newell, WV (US); Roger Clarke, Newell, WV (US); Gang Chen, Newell, WV (US)

(73) Assignee: GRACE TECHNOLOGIES, INC., Davenport, IA (US)

( * ) Notice: Subject to any disclaimer, the term of this patent is extended or adjusted under 35 U.S.C. 154(b) by 0 days.

(21) Appl. No.: 17/529,579

(22) Filed: Nov. 18, 2021

(65) Prior Publication Data

US 2022/0252645 A1  Aug. 11, 2022

Related U.S. Application Data

(60) Provisional application No. 63/198,858, filed on Nov. 18, 2020.

(51) Int. Cl.
| | |
|---|---|
| *G01R 19/155* | (2006.01) |
| *G01R 19/14* | (2006.01) |
| *G08C 17/02* | (2006.01) |
| *G08B 5/36* | (2006.01) |
| *G01R 31/66* | (2020.01) |

(52) U.S. Cl.
CPC .......... *G01R 19/155* (2013.01); *G01R 19/14* (2013.01); *G01R 31/66* (2020.01); *G08B 5/36* (2013.01); *G08C 17/02* (2013.01)

(58) Field of Classification Search
CPC ...... G01R 19/155; G01R 19/14; G01R 31/66; G01R 31/50; G08B 5/36; G08C 17/02
See application file for complete search history.

(56) References Cited

U.S. PATENT DOCUMENTS

| | | | | |
|---|---|---|---|---|
| 6,198,403 | B1* | 3/2001 | Dorrough | G01R 19/2513 324/133 |
| 10,901,013 | B2* | 1/2021 | Bollman | G01R 19/155 |
| 2005/0105230 | A1* | 5/2005 | Bailey | G01R 19/2513 361/90 |
| 2008/0042638 | A1* | 2/2008 | Hwang | H01R 29/00 324/133 |
| 2009/0085759 | A1* | 4/2009 | Lindsey | G01R 19/16542 340/660 |
| 2009/0212964 | A1* | 8/2009 | Hibma | G01R 19/16547 340/657 |
| 2020/0348343 | A1* | 11/2020 | Balid | G01R 31/66 |

(Continued)

*Primary Examiner* — Akm Zakaria
(74) *Attorney, Agent, or Firm* — Goodhue, Coleman & Owens, P.C.

(57) ABSTRACT

In order to mitigate a shock hazard for a user analyzing a high-voltage circuit, a system is provided that facilitates quarantining a shock-hazard high voltage within an electrical panel while providing a safe low voltage to a voltage detection indication device for visual inspection, the system comprising; a voltage conversion module (VCM) that receives input voltage from one or more monitored high voltage lines and reduces the received input voltage to below a predetermined voltage level that does not pose a shock hazard to a user; a voltage detection indication module that receives the reduced voltage and provides a visible voltage indication to the user; and a removable data transmission cable the connects the VCM to the voltage detection indication module.

18 Claims, 10 Drawing Sheets

(56) References Cited

U.S. PATENT DOCUMENTS

| | | | |
|---|---|---|---|
| 2021/0028641 A1* | 1/2021 | Llic | H02J 7/00714 |
| 2021/0263111 A1* | 8/2021 | Magno | G01R 1/067 |
| 2022/0418070 A1* | 12/2022 | Pang | H05B 45/385 |

* cited by examiner

WIRELESS VOLTAGE MEASUREMENT, TESTING AND ANALYTICS SYSTEM

CROSS-REFERENCE TO RELATED APPLICATIONS

The present application claims priority to U.S. Provisional patent application Ser. No. 63/198,858, filed on 18 Nov. 2020, the entirety of which is incorporated herein by reference.

BACKGROUND

The following relates to the electrical power arts. It particularly relates to monitoring a safe electrical disconnection of a high voltage circuit for servicing, and will be described with particular reference thereto. However, the following will also find application in routine monitoring of electrical line voltages and in other aspects of electrical safety.

To verify electrical isolation, electrical safety monitors which monitor electrical energy potentials of monitored electrical lines of an electrical panel are utilized. The electrical safety monitors provide a warning with light emitting diode ("LED") indicators in response to an electrical potential being present on the monitored lines. During servicing, electricians verify normal operation of the indicators while the panel is powered and then verify all of the indicators are extinguished while the panel is powered down before opening the panel. Although electrical safety monitors have proven to be reliable, final verification by lack of illumination provides less assurance than desired due to the possibility of circuit failure, or other malfunctions including but not limited to wire connection integrity, which could be the culprit for extinguished indicators and not just the absence of voltage on the monitored lines.

Additionally, although the operating current required for indication is extremely low, typically less than 1 milliampere at 750 VAC 3-phase, the electrical safety monitors are often rated for 750 VAC continuous operation or more, and the monitored line voltages entering the monitor are at full 3-phase line voltage potentials. To further electrically isolate the electrical safety monitors due to the high energy potential during operation, the housing of these monitors are typically non-conductive and the electronics are fully encapsulated in a high quality thermoset potting compound. It is desired to have the electrical safety monitor include a separate internally mounted electrical package and display adaptor mounted in the panel to provide an indication when an electrical potential is present on the monitored lines.

The following description contemplates an improved approach that overcomes the aforementioned limitations and others.

SUMMARY

The subject innovation relates to mitigating an electrical shock hazard for a user or technician analyzing, repairing, etc., a high-voltage device or circuit.

According to one aspect, a system is provided that facilitates quarantining a shock hazard within an electrical panel while providing a safe low voltage to a voltage detection indication device for visual inspection. The system comprises: a voltage conversion module (VCM) that receives input voltage from one or more monitored high voltage lines and reduces the received input voltage to below a predetermined voltage level that does not pose a shock hazard to a user; a voltage detection indication module that receives the reduced voltage and provides a visible voltage indication of the monitored lines to the user; and a detachable data transmission cable that connects the VCM to the voltage detection indication module (VDIM).

DETAILED DESCRIPTION

Figure 1:
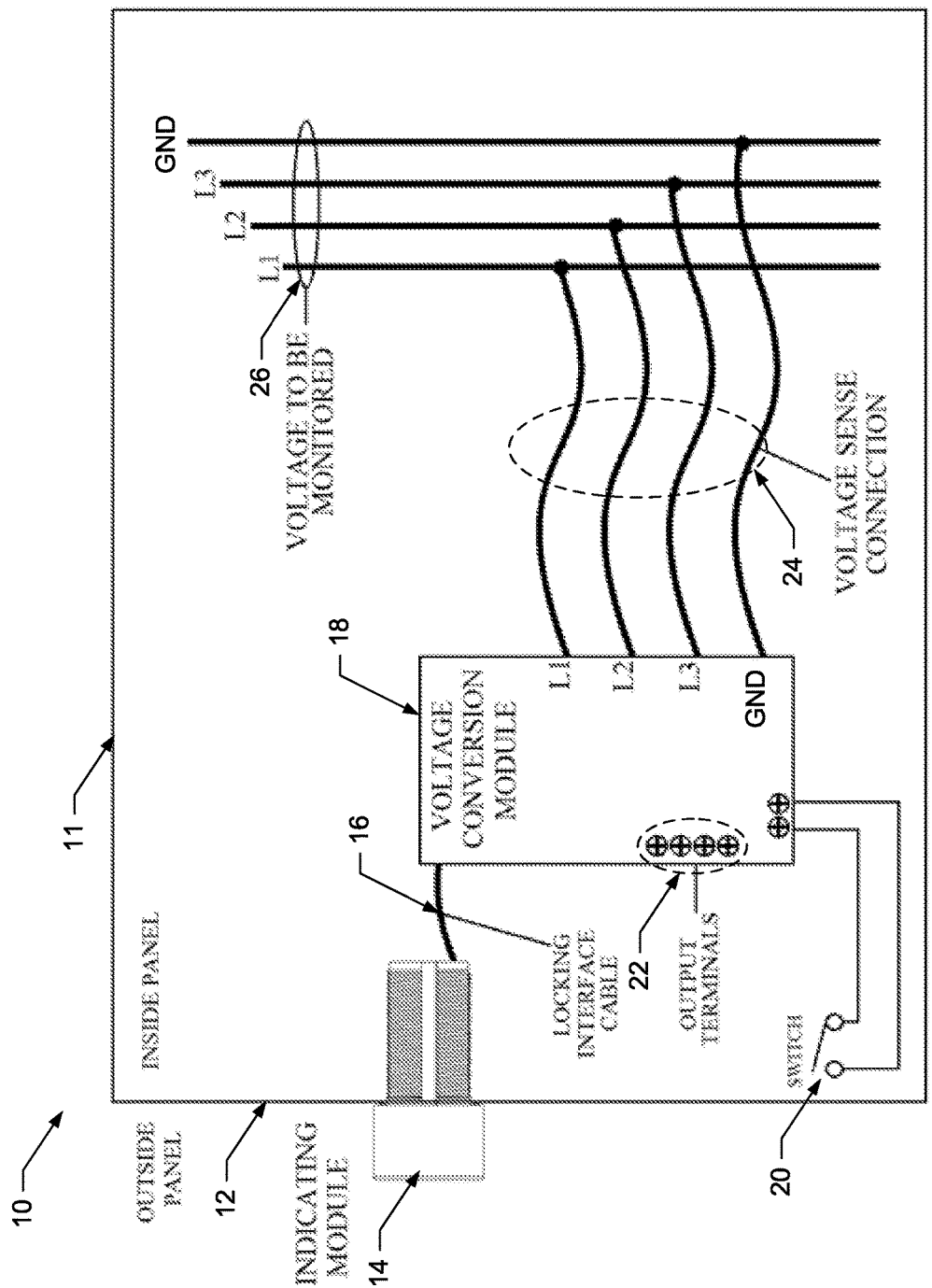
FIG. 1 illustrates a system that facilitates safely monitoring line voltages within an electrical panel or enclosure box, in accordance with one or more aspects described herein.

The problems to be solved relate to: a) how to monitor and test for the presence of AC and DC voltage in electrical panels while keeping a direct indication of the internal voltage level on a front panel while maintaining a non-hazardous voltage level on the external parts of the electrical panel enclosure, while providing a removable cable connecting the devices together; b) how to monitor and transmit a status of an electrical panel door closure switch as being open or closed; c) how to provide an indication of voltage within the electrical panel while protecting a user (technician or the like) by keeping the high voltage inside the electrical panel away from the external parts of the enclosure; d) how to accommodate different cable lengths depending on mounting locations (as conventional devices employ a fixed cable length between the two modules Conventional devices also do not indicate the presence of DC voltage without some user interaction and do not allow the voltage within the device to be monitored remotely. To solve these problems, the described systems and methods provide an all-in-one approach to solving the foregoing problems in order to improve user safety by reducing a hazard of shock while overcoming the aforementioned problems.

To this end, the herein-described device(s) (and systems and methods, etc.), according to one or more embodiments, employ modules that connect together with a removable cable that keeps the AC/DC status indication on an external region (e.g., a face of the voltage detector) outside of the electrical panel at a safe low voltage level on the front display, while the monitored high voltage is quarantined within a voltage conversion module that is mounted on the inside of the enclosure. In one embodiment, the claimed device(s) are configured to monitor an actionable status input or dry contact switch status that can be displayed and/or transmitted outside the enclosure. Actionable status input refers to, e.g., an input that can be used to detect a change in status level such as a transistor turning on and off, or resistance level change from external devices, without being limited thereto, whereas dry contact switch status refers to, e.g., input detecting a status change due to a switch opening or closing, without being limited thereto. In another embodiment, the device(s) employ two modules that utilize safety impedance to keep the hazardous shock level voltage from being transferred from within the electrical panel enclosure to an external surface of the enclosure. In another embodiment, a removable cable is provided that isolates the display module, which is typically mounted to be viewed on the outside of the enclosure, from the high voltage connected to the voltage conversion module on the inside of the enclosure. In another embodiment, the described device(s) utilize specific indication circuitry configured to indicate the presence of both AC voltage and DC voltage without any additional user interaction required.

In yet another embodiment, the device(s) described herein are configured to employ wireless communication (see FIG. 8), e.g., Bluetooth, Bluetooth MESH, Wi-Fi, etc., to permit transmission of device status, such as e.g., voltage level, test status, contact status, etc., to devices outside the enclosure. Still furthermore, the described device(s) provide a specialized charging circuit that uses the monitored voltage (internal to the electrical panel) to charge an internal supercapacitor or auxiliary power (e.g., battery or the like) to use as storage energy, that allows the device to be powered for a duration of time after the monitored voltage has been removed. The herein-described device(s) combine the described features into one or more modules that communicate together to occupy an existing "footprint" or panel space to current devices in the market.

FIG. 1 illustrates a system 10 that facilitates safely monitoring high line voltages (e.g., 750 VAC, 1000V DC, or the like) within an electrical panel or enclosure box 11, and providing a safe level of voltage (e.g., below 50V, 30V, or some other safe voltage level) at a measurement interface such as the described voltage detector device 14, in accordance with one or more aspects described herein. The described system comprises a voltage detector 14 (e.g., a universal power alert voltage indicator such as may be similar to those described in U.S. Pat. Nos. 6,703,938 and 9,013,296, which are hereby incorporated by reference in their entireties herein), which is mounted through a front plate 12 of the electrical panel or enclosure 11. The voltage detector 14 is coupled via a removable communication line 16 to a voltage conversion module (VCM) 18 that is coupled to a switch 20 and comprises a plurality of output terminals 22. The VCM 18 further comprises a plurality of voltage sensing wires, L1, L2, L3, and ground (GND) (collectively referred to herein as voltage sensing wires 24), which in turn are respectively connected to monitored lines L1, L2, L3, and GND wires (collectively referred to herein as monitored wires 26) for a monitored or tested circuit. In one embodiment, the VCM includes an input for actionable status information, as well as a pair of 2-wire outputs that control external devices and change status in relation to the input voltage and test configuration status in which is transmitted to the VDIM for indication and wireless transmission to other devices.

Figure 5:
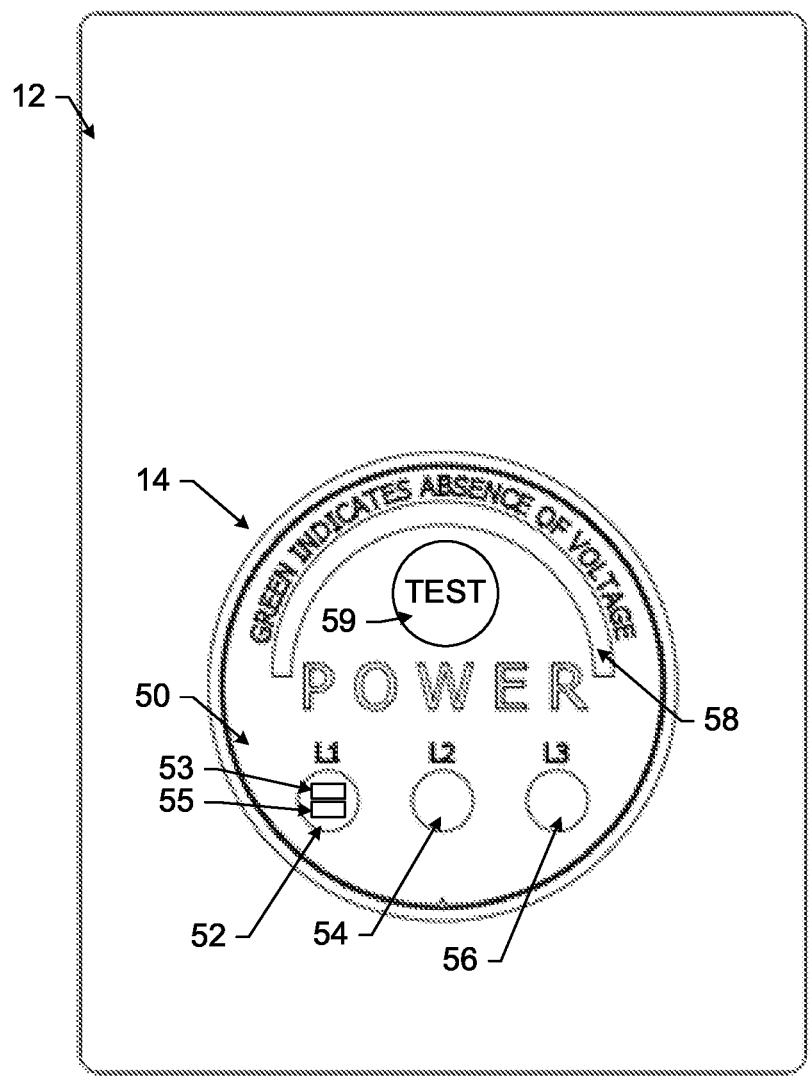
FIG. 5 illustrates a front view of the voltage detector, mounted through the front wall of the electrical panel or enclosure, in accordance with various aspects described herein.

The front face (not visible in FIG. 1; see reference numeral 50 in FIG. 5) of the voltage detector 14 includes a display (not visible in the side view of FIG. 1) serves as the main user interface that the end user (technician or the like) sees, and comprises 6 line status indicators: e.g., one for each phase for lines L1, L2 and L3, wherein within the same viewing window (indicator) a positive or negative indication is shown (see, e.g., polarity indicators 53, 55 of FIG. 5). The display also comprises an indicator (see FIG. 5, reference numeral 58) having a predetermined color (e.g., green or some other color) to indicate the absence of voltage, and a test activation indicator 59 (see FIG. 5). The voltage detector module 14 is further equipped to provide wireless communication for transmitting information outside the control panel. In certain described embodiments, the voltage detector includes a plug or jack configured to connect a removable cable having a retentive and removably lockable connectors (e.g., RJ45, RJ48, USB, etc.) that connects to the voltage conversion module 18.

The VCM 18 comprises voltage monitoring electronics (e.g., a printed circuit board (PCB) (not shown) comprising a processor and/or memory (not shown), electronic elements and circuitry, etc.). The VCM connects to voltage mains for the monitored circuit and is configured to withstand a maximum rated voltage of the lines monitored (e.g., 750 VAC, 1000V DC, or the like). The 4 wires connected to the mains may be permanently connected to the VCM with different markings and/or colors to indicate which phase each wire should be connected to. The dry contact switch 20 status connections and the output connections are provided with removable wire terminals. (e.g., screw-type clamps or the like).

During normal operation, the voltage detector 14 displays the monitored voltage via the voltage status indicators (e.g., LEDs 52, 54, 56 for respective monitored lines; see FIG. 5) provided on the face of the voltage detection module 14. When a minimum predetermined indication voltage (e.g., less than 20V, less than 10V, or some other predetermined minimum voltage threshold) is present between any two combinations or permutations of wires between Line 1, Line 2, Line 3 and Ground, the status indicators are ON and/or flashing on the face of the voltage detection module 14. In one example, the minim predetermined voltage the at which the voltage indicator 14 provides an indication via the LEDs is 10V DC/AC, although other minimum predetermined voltage levels are contemplated as will be appreciated by those of skill in the art. In one embodiment, the test status and/or green indicators (LEDs) may remain OFF during normal operation.

Figure 2:
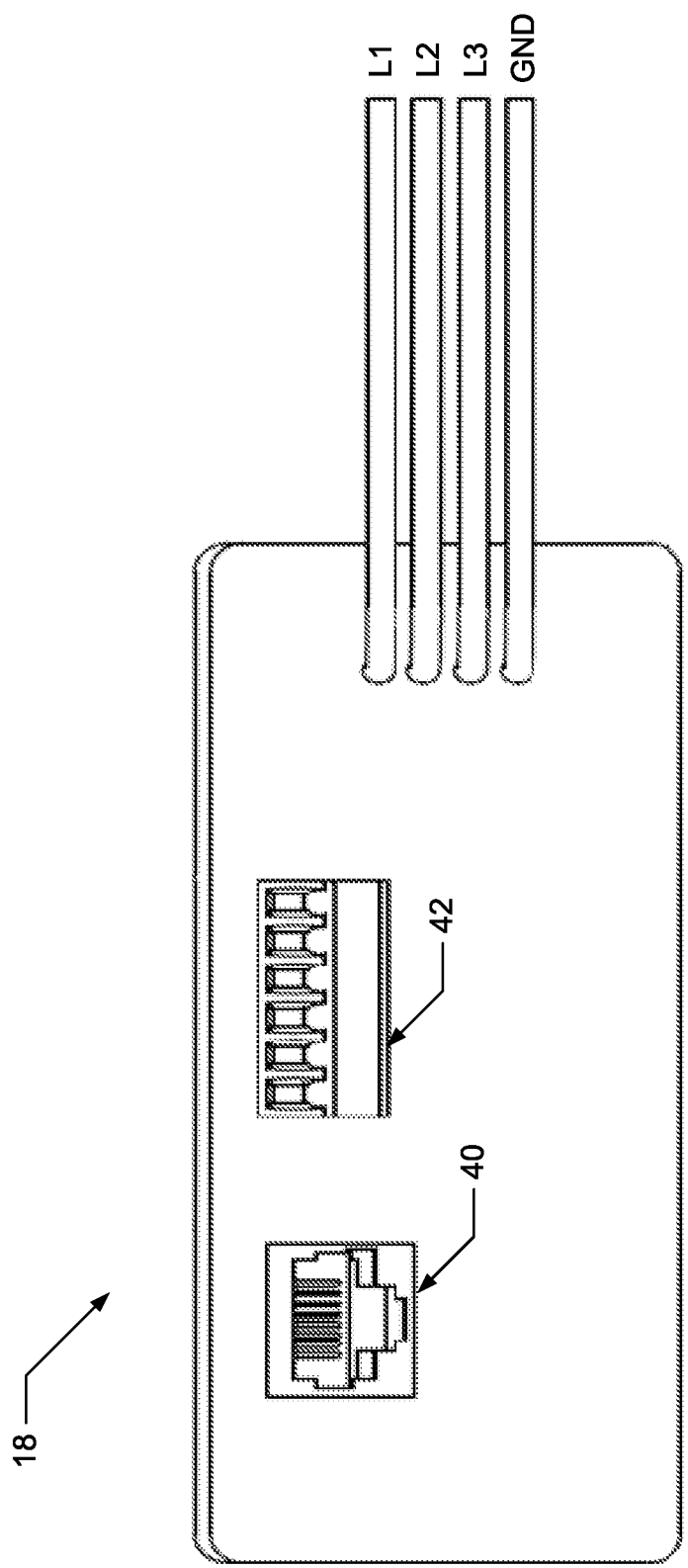
FIG. 2 illustrates a top view of the VCM, in accordance with various aspects described herein.

FIG. 2 illustrates a top view of the VCM 18, in accordance with various aspects described herein. Although described as a "top view," it will be appreciated that the VCM may be installed in any orientation is not necessarily required to be arranged with the illustrated "top" side facing upward. The illustrated view shows a RJ45 connection port 40 (e.g., such as may be used with a T1 type, E1 type, or other Ethernet data communication line) and a terminal block connection 42 (e.g., a screw type or push-in wiring connection block), although other types of connection ports (e.g., USB or the like) are contemplated and the illustrated example is not limited to the types of ports shown. Also shown are the connection wires L1, L2, L3, and GND that connect the VCM to the monitored mains.

Figure 3:
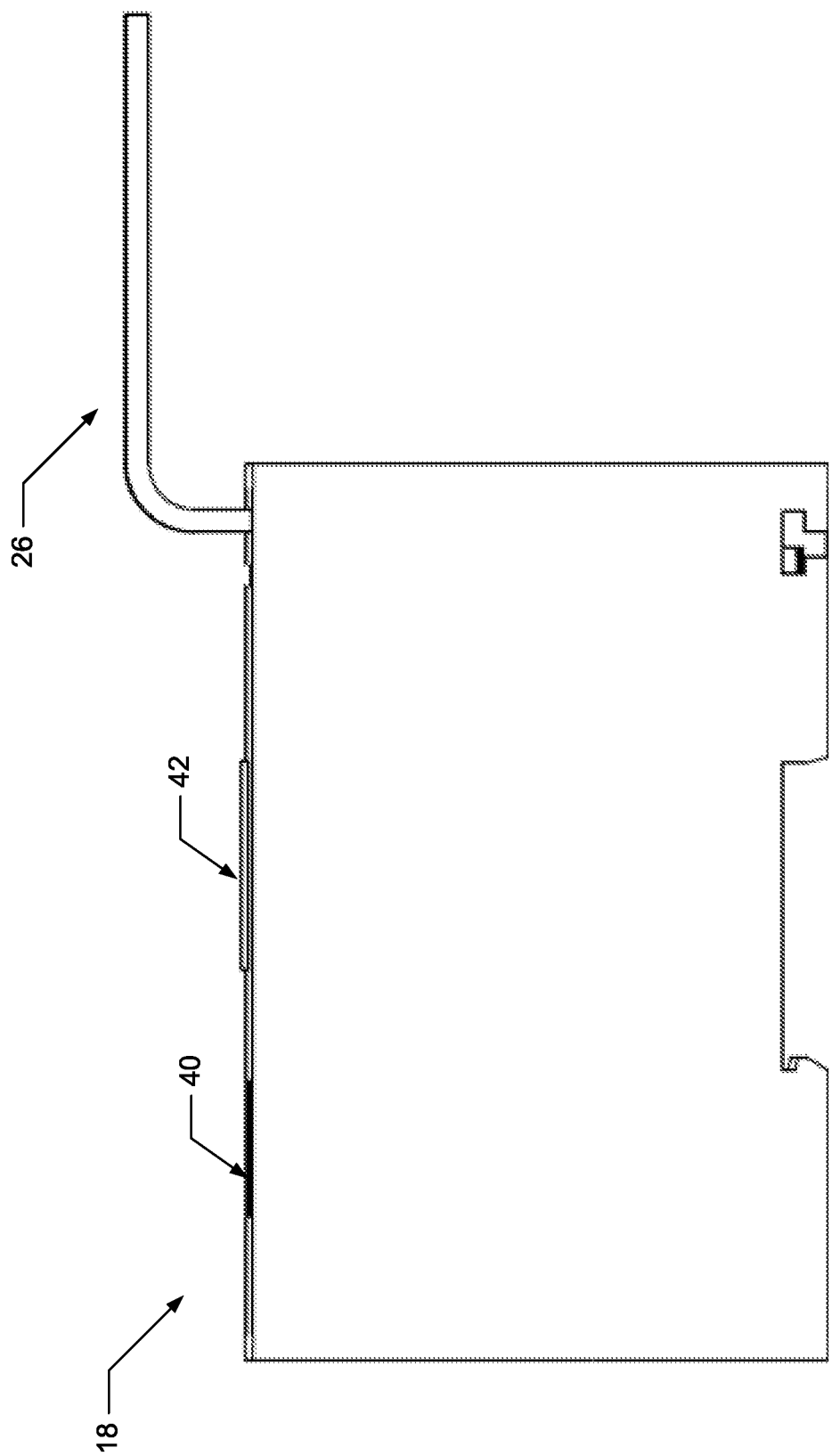
FIG. 3 illustrates a side view of the VCM, in accordance with various aspects described herein.

FIG. 3 illustrates a side view of the VCM 18, in accordance with various aspects described herein. Although described as a "side view," it will be appreciated that the VCM may be installed in any orientation is not necessarily required to be arranged with the illustrated "side" being perpendicular to the ground. The illustrated view shows a RJ45 (or RJ48 or other suitable communication port) connection port 40 and a terminal block connection 42, although other types of connection ports are contemplated and the illustrated example is not limited to the types of ports shown. Also shown are the connection wires L1, L2, L3, and GND (collectively, reference numeral 24) that connect the VCM to the monitored mains.

Figure 4:
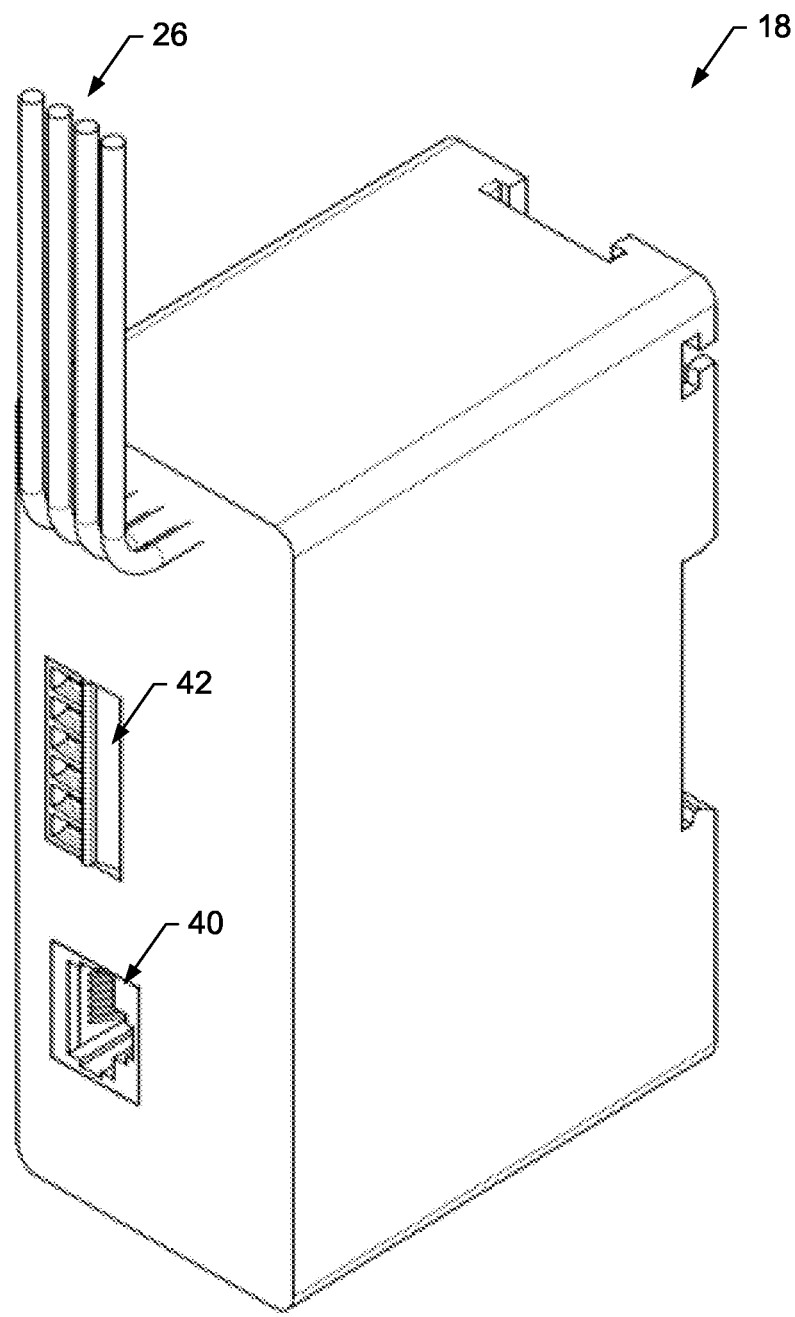
FIG. 4 illustrates a perspective view of the VCM, in accordance with various aspects described herein.

FIG. 4 illustrates a perspective view of the VCM 18, in accordance with various aspects described herein. The illustrated view shows a RJ45 (or RJ48 or other suitable communication port) connection port 40 and a terminal block connection 42, although other types of connection ports are contemplated and the illustrated example is not limited to the types of ports shown. Also shown are the connection wires L1, L2, L3, and GND (collectively, reference numeral 24) that connect the VCM to the monitored mains.

FIG. 5 illustrates a front view of the voltage detector 14, mounted through the front wall 12 of the electrical panel or enclosure, in accordance with various aspects described herein. The face 50 of the voltage detector 14 comprises a plurality of indicators 52, 54, 56 (e.g., one for each of monitored lines L1, L2, and L3, respectively), as well as an absence-of-voltage indicator 58, and a test activation indicator 59 that indicates that a test for a monitored circuit is active. As shown in the indicator 52 for L1, a positive polarity indicator 53 and a negative polarity indicator 55 are provided. Although shown only in the indicator 52 for L1 for purposes of simplicity in the Figures, it will be understood that each of the indicators 52, 54, 56, includes a positive polarity indicator 53 and a negative polarity indicator 55, such that polarity of detected voltages on each of L1, L2, and L3 can be indicated.

Figure 6:
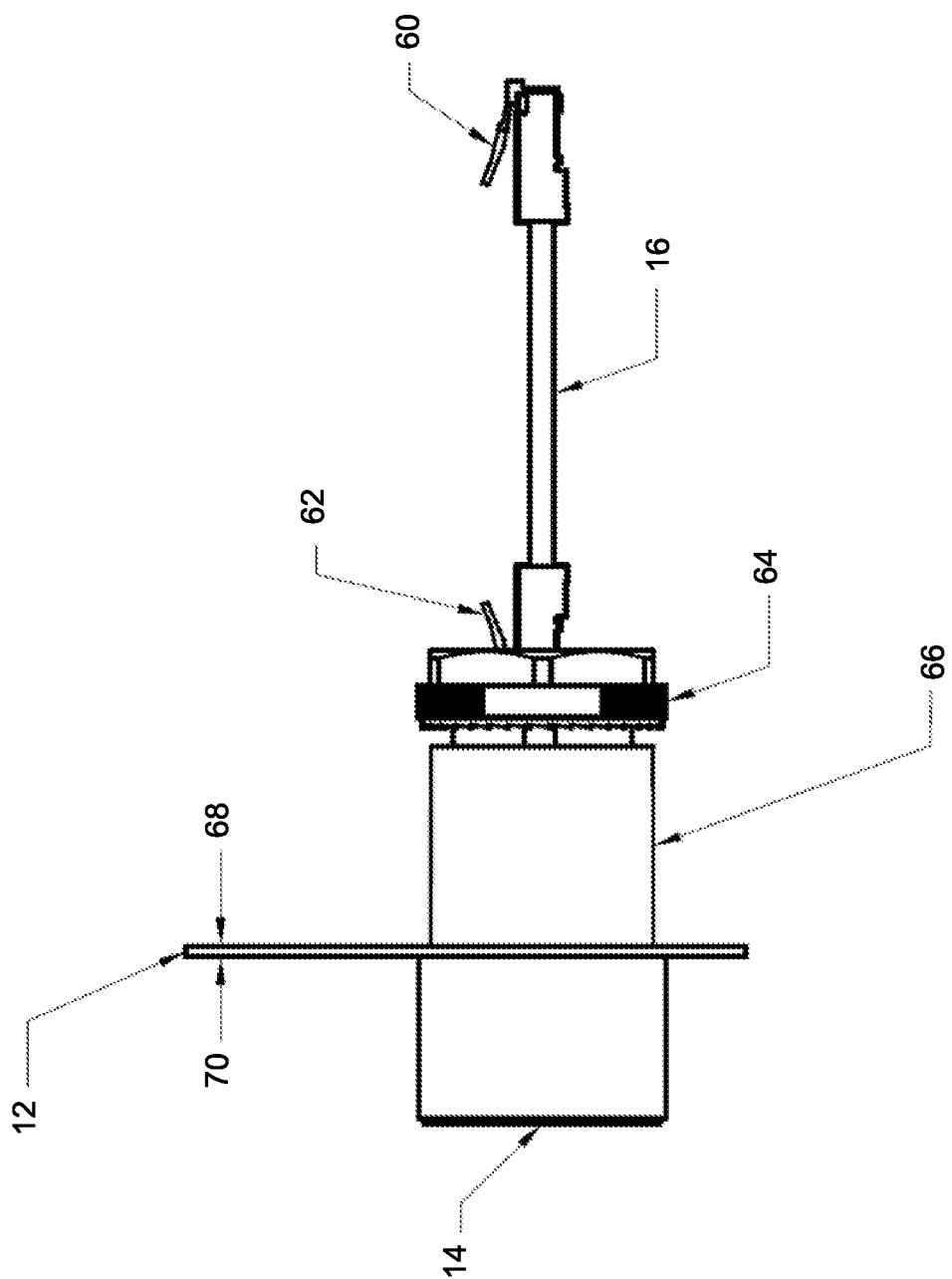
FIG. 6 illustrates a side view of the voltage detector mounted through the front plate of the electrical panel or enclosure box.

FIG. 6 illustrates a side view of the voltage detector 14 mounted through the front plate 12 of the electrical panel or enclosure box. The illustration of FIG. 6 also shows the retentive but removeable communication line 16 and a first removably lockable communication connector (e.g., an RJ45 or RJ48 connector as illustrated in FIG. 6, although other connectors are contemplated including without limitation: USB, USB mini, USB micro, USB-C, or any other suitable data connector for transceiving data between the voltage detector 14 and the VCM (not shown in FIG. 6), which connects the removable communication cable 16 to the VCM. A second removably lockable communication connector 62 (shown as an RJ45 connector although other communication connectors and contemplated as discussed above with regard to the connector 60), is shown for removably and lockably connecting the communication line 16 to the voltage detector device.

A retaining nut 64 is provided that, when engaged with a corresponding threaded portion (not shown) on the rear of the voltage detection device 14 and actuated to install the voltage detector device 14, biases a spacing sleeve 66 toward and against a rear side 68 of the front plate 12 while pulling the front display portion 50 of the voltage detector device 14 rearward toward and against a front side 70 of the front plate 12.

Figure 7:
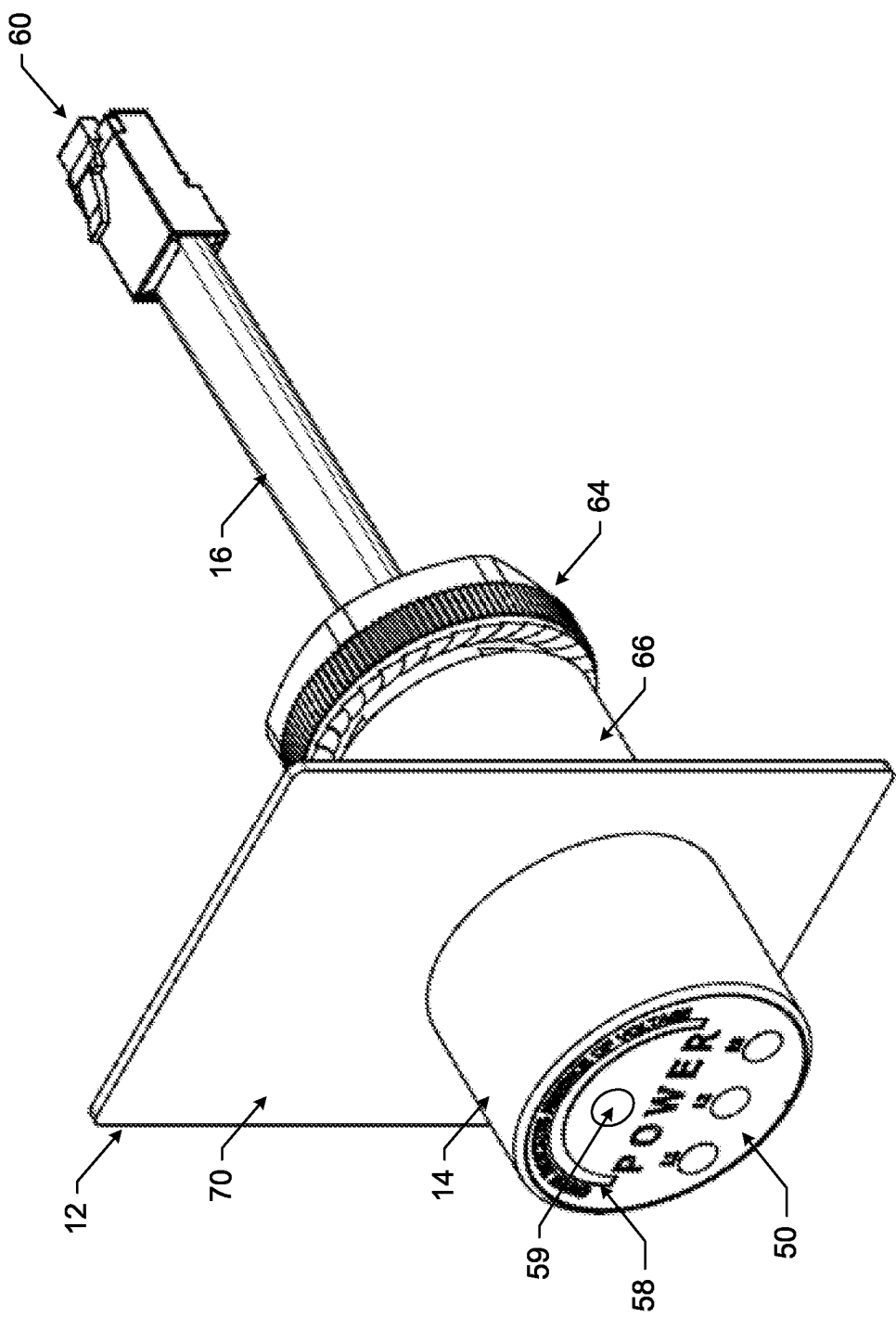
FIG. 7 illustrates a perspective view of the voltage detector mounted through the front plate of the electrical panel or enclosure box.

FIG. 7 illustrates a perspective view of the voltage detector 14 mounted through the front plate 12 of the electrical panel or enclosure box. The illustration of FIG. 7 also shows the retentive but removeable communication line 16 and a first removably lockable communication connector (e.g., an RJ45 or RJ48 connector as illustrated in FIG. 7, although other connectors are contemplated including without limitation: USB, USB mini, USB micro, USB-C, or any other suitable data connector for transceiving data between the voltage detector 14 and the VCM (not shown in FIG. 7), which connects the removable communication cable to the VCM. A second communication removably lockable connector (not visible in the perspective view of FIG. 7; see instead FIG. 6) removably and lockably connect the communication line 16 to the voltage detector device.

A retaining nut 64 is provided that, when engaged with a corresponding threaded portion (not shown) on the rear of the voltage detection device 14 and actuated to install the voltage detector device 14, biases a spacing sleeve 66 toward and against a rear side 68 of the front plate 12 while pulling the front display portion 50 of the voltage detector device 14 rearward toward and against a front side 70 of the front plate 12.

With continued reference to FIGS. 1-7, FIG. 8 illustrates a circuit schematic 100 that facilitates quarantining high voltage from a monitored circuit within an electrical panel or enclosure while providing a reduced voltage to a voltage detection indicator module (voltage detector 14 of the previous figures), in accordance with various features described herein. The L1, L2, L3 and GND connections (collectively referred to by reference numeral 24) on the voltage conversion module 18 connect to the respective main voltage lines (reference numeral 26 in previous figures) to be monitored. The dry contact detection input is configured to connect to, e.g., a switch that indicates door closure status. Outputs can be configured to communicate external confirmation that a voltage level test was below a predetermined threshold, and can also be configured for other purposes such as indicating voltage error conditions.

The input line voltage from lines L1, L2, L3, and GND is received at a common connection point 104 and then paralleled to the voltage indication circuit 106, the power storage circuit 108, and the voltage level detection circuit 110 as illustrated.

In a different embodiment there are 2 input lines from each phase of L1, L2, L3 and Gnd that go to a common connection point 104 and are then paralleled to the voltage indication circuit 106, the power storage circuit 108, and the voltage level detection circuit.

The voltage indication circuit 106 facilitates the direct indication of the monitored voltage level for each respective line and limits the total voltage to a safe, non-hazardous (i.e., non-shock) level that can then be transferred out the display on the face of the voltage detector module 14.

The power storage circuit 108 stores the energy from the monitored/detected voltage information for each respective line, such that it can be concurrently transmitted in parallel to the power module microcontroller unit (MCU) 112 circuit in the voltage conversion module 18 and the supercapacitor storage circuit 114 in the voltage detector module 14. The supercapacitor storage circuit stores charge to allow enough energy to be stored to run the device for a given time once power is removed (e.g., due to a power outage, power cessation for testing the monitored circuit or other components of the system including but not limited to the voltage detection module 14 and/or the voltage conversion module 18, or any other power cessation circumstance).

The voltage level detection circuit 110 monitors the measured voltage from the common connection point 104 to determine the voltage level present on the monitored lines L1, L2, L3, GND (or any number of monitored lines) and transfers voltage information to the power module MCU circuit 112. In one embodiment, the voltage level detection circuit 110 cooperates with two different types of control, including software control 116 and hardware control 118. The software control determines if the input voltage level is too high or too low (e.g., outside of a predetermined range of voltage values) such that it adjusts impedance to the MCU inputs in order to keep the voltage measurements at an accurate level. The hardware control provides a backup to the software that, when the monitored voltage level is too high, automatically adjusts the impedance level to a more accurate level. In a second embodiment, the voltage level detection circuit utilizes two wire connections per monitored line (i.e., L1, L1', L2, L2', L3, L3', and GND, GND', (L1', L2', L3', and GND' not shown) wherein the system is configured to determine the connection integrity status of the monitored lines to determine whether both sets of wires for L1, L1', L2, L2', L3, L3', and GND, GND' are connected to the same wire connection point or whether there is a wiring fault between any two of the monitored line connections transmit it the VDIM for visual indication and wireless output.

The front display MCU and wireless communication module 120 control the test activation circuit 122 and the wireless output 124 of the monitored voltage, dry contact switch 126 status and test status 128 received from the power module MCU circuit 112. The power module MCU circuit 112 also monitors the voltage level detection circuit and adjusts accordingly the impedance in order to maintain accurate voltage monitoring according to a predefined accuracy level. The power module MCU circuit processes the monitored voltage through an algorithm to determine the voltage level for a given line, monitors the dry contact input status, and transmits the data recorded to the front display MCU 120. The unit output 130 is displayed when a "no voltage" test mode has been achieved, and/or can be configured to show status of one or more error conditions.

Figure 8:
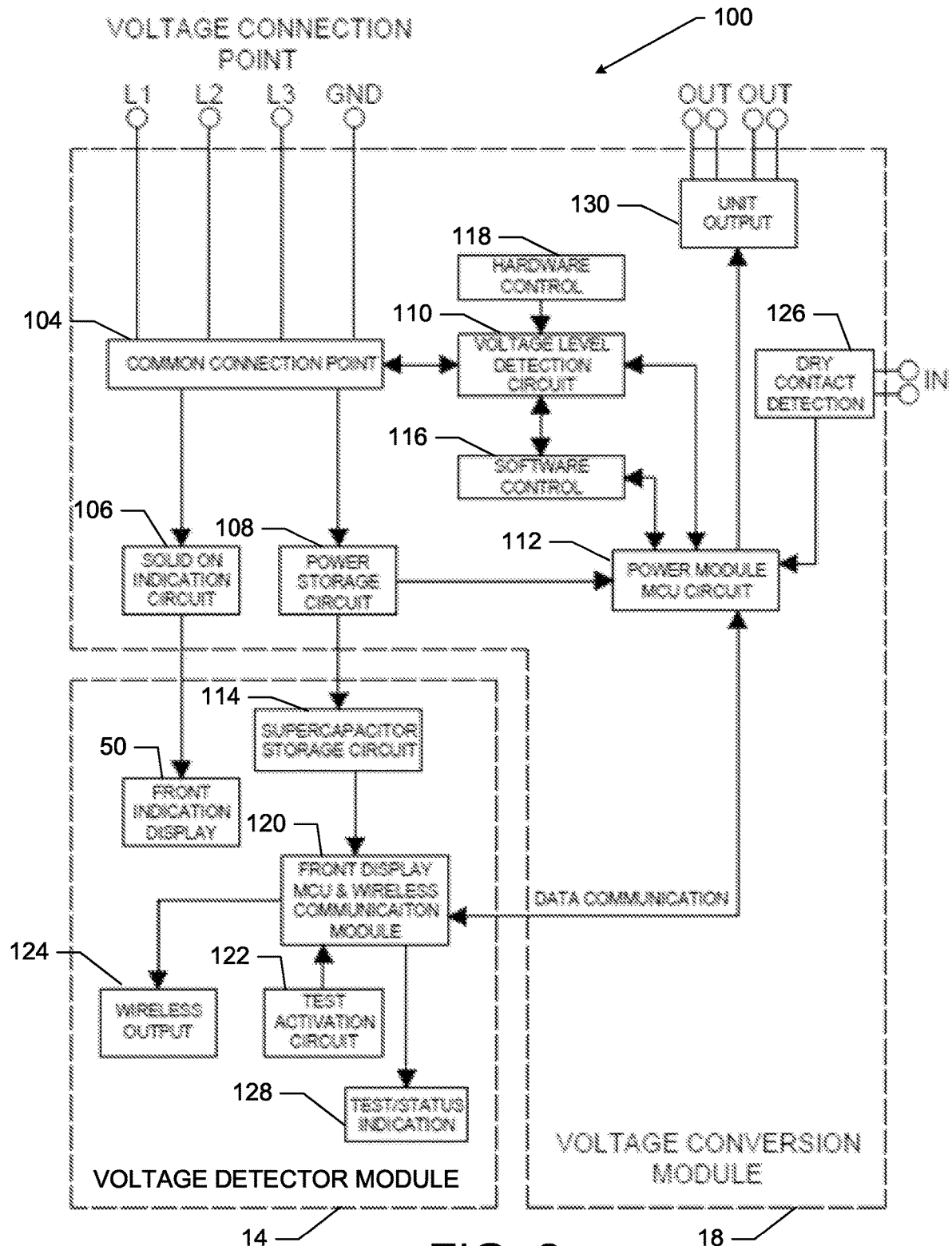
FIG. 8 illustrates a circuit schematic \ that facilitates quarantining high voltage from a monitored circuit within an electrical panel or enclosure while providing a reduced voltage to a voltage detection indicator module, in accordance with various features described herein.

According to an embodiment, there are four modes of operation for the circuit described in FIG. 8: the first is normal operation; the second is test mode with power detected; the third is test mode with power removed; and the fourth is power removed. There is the possibility of a few error conditions with operation as well.

Normal operation occurs when a test is not active and power is applied to two or more of the voltage connection points. In this mode the voltage indication circuit is active and relays the information to the front indication display 58 on the voltage detector module 14. The VDIM indicates the voltage and corresponding current flow between any two of the L1, L2, L3 and GND monitored lines wherein an AC or DC signal is detected and visually displayed on the front indicators 52, 54, or 56 with polarity shown via 53 and 55 indicators. Additionally, the power storage circuit 108 uses the energy from the monitored lines to charge the supercapacitor storage circuit 114 while running the power module MCU circuit 112. The power module MCU circuit gathers information and transmits it to the front display 58 to be transmitted wirelessly outside of the electrical enclosure or panel. In this mode of operation both the VCM and VDIM are in a low power status to conserve energy.

The second mode of operation is test mode with power detected. If the power detected is above the predetermined front indication display 58 threshold, then indicators for the voltage phases are active and provided. Once the test activation from the voltage detector display module 14 is activated, the front display MCU 120 transmits data to the power module MCU 112 indicating that a test has been activated. At this point, the device the device executes an algorithm for an internal test. The power module MCU transmits an indication that the voltage detected is above the threshold to the front display MCU 120 so it can then show a test status indication 128 indicating that voltage was detected. The connection integrity is verified by the MCU to ensure that each wire is connected to the correct monitored line. If there is a wiring fault between any two of the monitored lines, the connection status is indicated and transmitted to the VDIM to visually indicate the error and send it to the wireless output to be transmitted and further processed. The power module MCU also activates the unit's dual 2-wire outputs 130 that control external devices, when configured to do so, transmitting the dual 2-wire output actionable status change to the VDIM for visual and wireless indication. Between tests, the device is recharged via the monitored lines (e.g., via the supercapacitor storage unit 114). During this test mode the VDIM indicates the condition status of the plurality of the monitored inputs lines and any other pertinent information related to the L1, L2, L3 and GND connections. In this mode of operation the VCM and VDIM are in full operation and once the test sequence is completed the both will switch back to a lower power status to conserve energy.

The third mode of operation is test mode with power removed. The stored energy from the monitored lines allows the device to perform test sequences to verify unit operation. Once the test activation from the display module is activated, the front display MCU sends data to the power module MCU indicating that a test has been activated. The device begins to execute an algorithm for the internal test. The power module MCU transmits an indication that the voltage level detected is below the predetermined threshold to the front display MCU so that the front display MCU can indicate that the voltage detected was below the detection threshold and is considered safe. The connection integrity is verified to ensure that each wire is connected to the correct monitored line. If there is a wiring fault between any two of the monitored lines, the connection status is indicated and transmitted to the VDIM to visually indicate the error and send it to the wireless output to be transmitted and further processed. The power module MCU can also be configured to activate the unit's two 2-wireoutputs. Each test run will remove some testing capability from unit until the device will no longer have enough charge to run the test. Between tests, the device is recharged via the monitored lines (e.g., via the supercapacitor storage unit 114). During this test mode the VDIM indicates the condition status of the plurality of the monitored inputs lines and any other pertinent information related to the L1, L2, L3 and GND connections. In this mode of operation the VCM and VDIM are in full operation and once the test sequence is completed the both will switch back to a lower power status to conserve energy.

A fourth mode of operation occurs when power is removed. During this mode, wireless communications are disabled and the internal charge for running the device without power may be slowly depleted until power is reapplied.

Figure 9A:
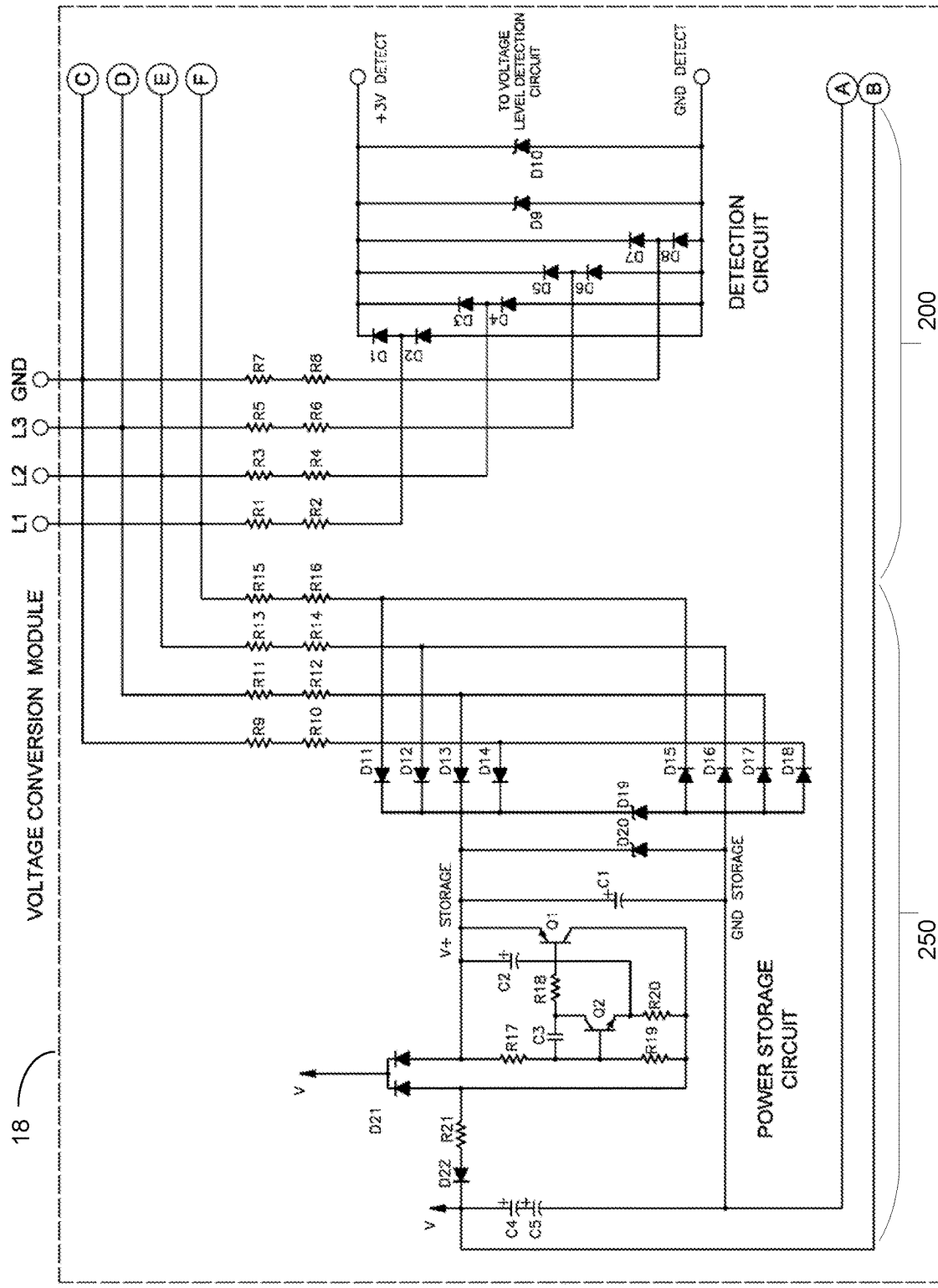
FIGS. 9A and 9B show a schematic overview of the cooperating circuits of the voltage conversion module (FIG. 9A and carried over into FIG. 9B) and the voltage detection module (FIG. 9B) and their interaction via the lockably removeable cable (FIG. 9B), in accordance with various aspects described herein.
Figure 9B:
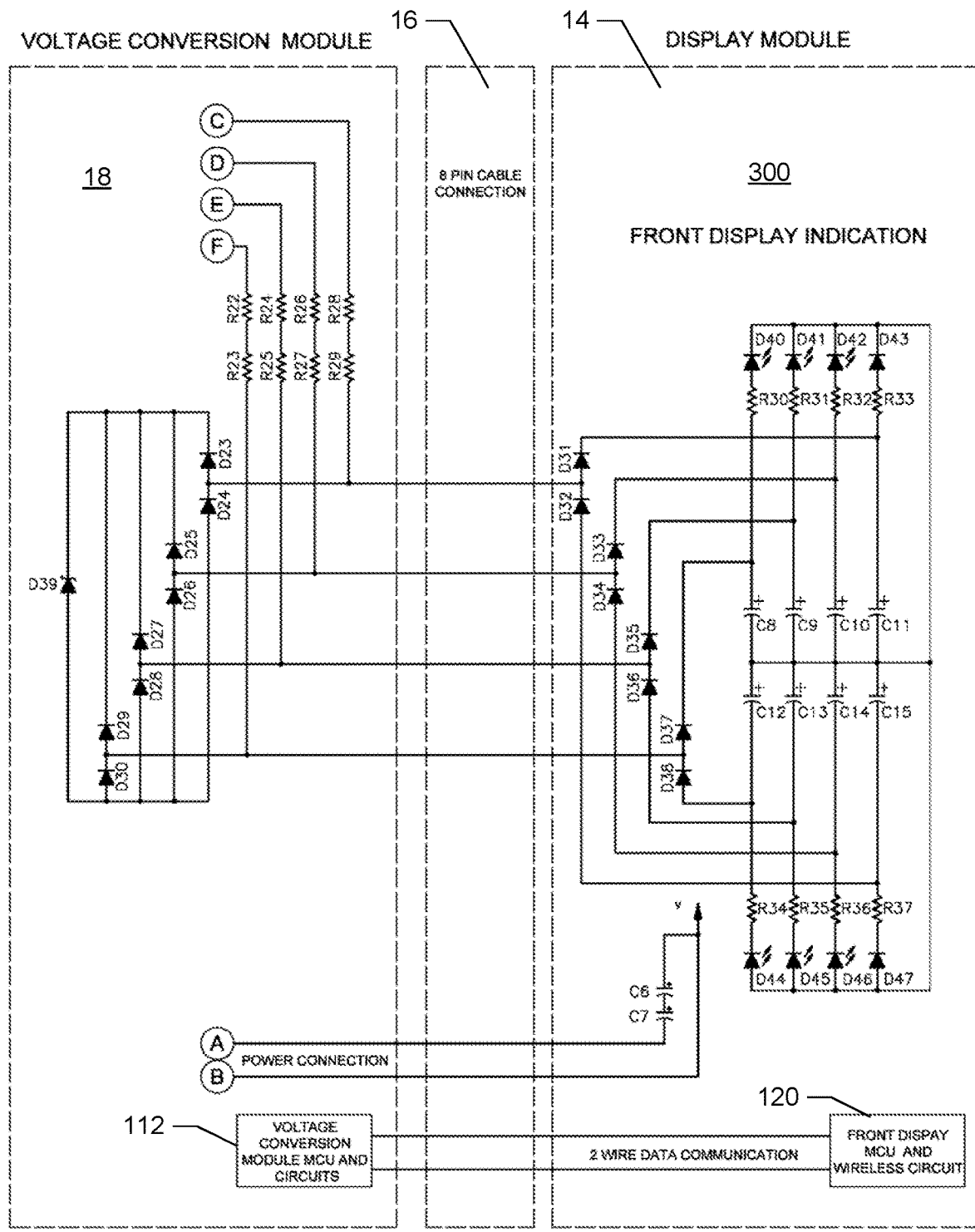

FIGS. 9A and 9B show a schematic overview of the cooperating circuits of the voltage conversion module 18 (FIG. 9A and carried over into FIG. 9B) and the voltage detection module 14 (FIG. 9B) and their interaction via the lockably removeable cable 16 FIG. 9B, in accordance with various aspects described herein.

At the common connection point (shown as input lines L1, L2, L3, and GND coming into the voltage conversion module 18 in FIG. 9A), the unit splits off into 3 different parallel circuits that branch respectively from the L1, L2, L3 and GND connections. The first circuit is the voltage detection circuit 200, the second circuit is the power storage circuit 250, and the third circuit is the voltage indication circuit 300 (also referred to herein as the front display indication circuit in FIG. 9B).

Detection Circuit 200 operation: At the common connection point input resistors connect to each phase (L1, L2, L3, and GND) to limit the current available to the detection circuit. With all four line connections going to the 4 wire bridge connection this way, the detection circuit 200 is able to detect voltage between any 2 or more of the line connections.

According to an example, when AC power is applied to connections to L1 and L2 on the positive cycle, the current starts at L1 and then flows via the parallel connection of the common connection of L1, then flows through the series connection of the two resistors R1 and R2 to the parallel connection of D1 and D2 and on to parallel connection of D1, D3, D5, D7, D9, and D10 to the +3V Detect circuit. If the voltage is above the limit of the Zener diodes D9 and D10, then the voltage is limited to that threshold. The return path comes through the GND detect connection, to the parallel connection of diodes D2, D4, D6, D8, D9 and D10 with it flowing out D4 to the series connection of R4 and R3 to the common connection of L2 out to L2. For the negative cycle path of L2 to L1 then current flow direction would be reversed.

Power storage circuit 250 operation: At the common connection point, the current resistors connect to each phase to limit the current available to the power storage circuit. With all four line connections going to bridge connection this way, this allows the circuit to be able to charge from any two or more of the line connections.

According to an example, when AC power is provided to connections L1 and L2 on the positive cycle, the current starts at L1 and then flows to the parallel common connection of L1, then on to the series connection of resistors R9 and R10 to the parallel connection of D14 and D18. If the voltage level exceeds the limit of Zener diodes D19 and D20, then the voltage is limited to that threshold. The current then flows to the parallel connection of D19, D20 C1, Q1, C2, R17 and D21. The current begins to charge up capacitors C1 and C2. The current continues to flow through the series connection of R17 to R19, R21, and then to D22 to start charging up the supercapacitors C4, C5 and then C6, C7 through the power connection on the 8 pin cable connection. When enough voltage has built up to turn on Q2 (e.g., an NPN transistor) and will then pulse Q1 (e.g., a PNP transistor) allowing for a lower impedance path to the series connection of R21, which then charges the supercapacitors C4, C5, C6, and C7 more quickly. The return path advances through the parallel connection of C5, C7, C1, D19, D20, D15, D16, D17, and D18, which flow through D17 to the parallel connection of D13 and R12. The current continues to flow through the series connection of R12 and R11 to the common connection of L2 out to L2.

Front display indication circuit 300 operation: At the common connection point the current resistors connect to each phase (L1, L2, L3, and GND) to limit the current available to the front display indication circuit. With all four line connections going to the same bridge connection this way, the circuit is able to give an indication of voltage from any two or more connections from power.

According to an example, when AC power is applied to connections for L1 and L2 on the positive cycle, the current begins to flow at L1 and then to the parallel connection of common connection of L1, and then flows through the series connection of R22 and R23 to the parallel connections of D29, D30 and through the 8 pin cable connection to D37 and D38. Current flow continues from D29 to the parallel connection of D39, D27, D25 and D23. If the voltage exceeds the limit of the Zener diode D39, then the voltage is limited to that threshold. The return path flows through D39 to the parallel connection of D39, D30, D28, D26, and D24 out the parallel connection of D28, D27, R25 to D35 and D36 through the 8 pin cable connection. Current flow continues through the series connection R25 to R24 to the common connection of L2 out to L2. Concurrently, the power flows from R23 through the 8 pin cable connection to D37 and D38, flowing out D37, and then flowing to the parallel connection of C8 and R30. Capacitor C8 begins to charge, with current flow through R30 to the series connection D40 and to the parallel connection of D40 to D47 and C8 to C15. Current then flows out D45 through series connection R35 to parallel connection of D36 and C13 charging C13, and then through D36 to parallel connection of D35, D36 through the 8 pin cable connection to parallel connection of D27, D28 and R25. Flow continues through R25 and through the series connection of R24 to the common connection of L2 out to L2. For the negative cycle path of L2 to L1, the current flow direction would be reversed.

The claimed innovation has been described with reference to the various embodiments. Modifications and alterations will occur to others upon reading and understanding the preceding detailed description. It is intended that the embodiments described herein be construed as including all such modifications and alterations insofar as they come within the scope of the appended claims or the equivalents thereof.

The invention claimed is:

1. A system that facilitates quarantining a shock hazard within an electrical panel while providing a safe low voltage for visual inspection, comprising:
   a voltage conversion module (VCM) that receives input voltage from one or more monitored high voltage lines and reduces the received input voltage to below a predetermined voltage level that does not pose a shock hazard to a user; and
   a voltage detection indication module (VDIM) electrically connected to the voltage conversion module that receives the reduced input voltage and provides a visible voltage indication of the monitored lines to the user on a front indication display, the front indication display powered by the reduced input voltage from the voltage conversion module and wherein the front indication display comprises at least one light emitting diode (LED) electrically connected to the reduced input voltage for each of the monitored high voltage lines;
   wherein the monitored high voltage lines have L1, L2, L3, and GND connections associated therewith and wherein the voltage detection indication module (VDIM) indicates the voltage and corresponding current flow between any two of the L1, L2, L3, and GND connections, wherein the input is one of AC Single Phase, AC 3-phase, or DC;
   wherein the indication of the voltage and current flow is shown with respect to polarity while a test sequence is not active.

2. The system according to claim 1, wherein the voltage conversion module (VCM) and the voltage detection indication module (VDIM) are electrically connected with a detachable cable which is a USB data communication interface.

3. The system according to claim 1, wherein the voltage conversion module (VCM) and the voltage detection indication module (VDIM) are electrically connected with a detachable cable which is a T1-type data communication interface.

4. The system according to claim 1, wherein the voltage detection indication module comprises a plurality of LEDs configured to indicate at least one of: a voltage presence, a voltage absence, and a voltage polarity.

5. The system according to claim 4, wherein the plurality of LEDs respectively indicate a voltage presence and polarity of the one or more of monitored high voltage lines.

6. The system according to claim 1, wherein the voltage conversion module (VCM) is configured to detect connection integrity of source leads to the voltage detection indication device with use of storage energy or auxiliary power.

7. The system according to claim 1, wherein the voltage conversion module (VCM) is configured to transmit and receive device status information to and from a wireless module that is configured to transmit via Bluetooth, to IoT devices or SCADA systems for making actionable decisions.

8. The system according to claim 1, wherein the voltage conversion module (VCM) is configured to transmit and receive device status information to and from a wireless module that is configured to transmit via Zigbee, to IoT devices or SCADA systems for making actionable decisions.

9. The system according to claim 1, wherein the voltage conversion module (VCM) is configured to transmit and receive device status information to and from a wireless module that is configured to transmit via Wi-Fi, to IoT devices or SCADA systems for making actionable decisions.

10. The system according to claim 1, wherein the voltage conversion module (VCM) comprises an actionable status that is at least one of: displayed on the indication module; and transmitted wirelessly from the indication module.

11. The system according to claim 1 wherein the voltage conversion module (VCM) comprises two 2-wire outputs that control external devices while simultaneously actionable status is displayed on the voltage detection indication module (VDIM) and is transmitted to a wireless output.

12. The system according to claim 1 wherein the voltage conversion module (VCM) uses stored energy from the monitored lines to charge a supercapacitor storage circuit and supply power to the voltage conversion module (VCM).

13. The system according to claim 1, wherein the voltage detection indication module (VDIM) comprises a wireless output that communicates with the voltage conversion module (VCM) for sending and receiving data.

14. The system according to claim 1, wherein the voltage detection indication module (VDIM) comprises a test activation circuit configured to initiate test sequences for a predetermined duration in order to at least one of: verify; and communicate status for the voltage detection indication device to other devices.

15. The system according to claim 1, wherein the voltage detection indication module (VDIM) is configured to indicate a condition status of a plurality of monitored input lines L1, L2, L3 and GND connections, wherein the input is one of AC Single phase, AC 3-phase, or DC.

16. The system according to claim 1, wherein connection integrity status of the monitored lines is determined and indicated on the voltage detection indication module (VDIM) and communicated to a wireless output.

17. The system according to claim 1 wherein the voltage conversion module (VCM) and voltage detection indication module (VDIM) receive a retentive and lockable communication cable.

18. The system according to claim 1, further comprising a spacing sleeve that presses against an outside of a rear panel of an electrical enclosure box and is secured with a nut that secures the voltage detection indication module (VDIM) in the electrical enclosure box upon tightening.

\* \* \* \* \*